United States Patent [19]
Kohno

[11] Patent Number: 5,565,802
[45] Date of Patent: Oct. 15, 1996

[54] SEMICONDUCTOR DEVICE WITH DIFFERENTIAL AMPLIFIER OPERABLE AT HIGH SPEED

[75] Inventor: Takaki Kohno, Tokyo, Japan

[73] Assignee: NEC Corporation, Tokyo, Japan

[21] Appl. No.: 302,270

[22] Filed: Sep. 8, 1994

[30] Foreign Application Priority Data

Sep. 8, 1993 [JP] Japan .................... 5-248825

[51] Int. Cl.⁶ ............................ H03K 5/153; H03K 3/12
[52] U.S. Cl. ......................... 327/87; 327/74; 327/205
[58] Field of Search ........................ 327/73, 74, 87, 327/67, 77–81, 88, 89, 560, 561, 562, 563, 374, 68, 205; 330/85, 293; 365/189.05, 210, 233.5

[56] References Cited

U.S. PATENT DOCUMENTS

| | | | |
|---|---|---|---|
| 3,569,739 | 3/1971 | Stolman | 327/88 |
| 4,581,545 | 4/1986 | Beale et al. | 327/73 |
| 4,926,068 | 5/1990 | Fujita | 327/205 |
| 5,319,265 | 6/1994 | Lim | 327/73 |

FOREIGN PATENT DOCUMENTS

| | | | |
|---|---|---|---|
| 57-26922 | 2/1982 | Japan | 327/73 |
| 59-188226 | 10/1984 | Japan | 327/73 |
| 60-65614 | 4/1985 | Japan | 327/73 |
| 61-25319 | 2/1986 | Japan | 327/73 |
| 3-142790 | 6/1991 | Japan . | |

Primary Examiner—Toan Tran
Attorney, Agent, or Firm—Sughrue, Mion, Zinn, Macpeak & Seas

[57] ABSTRACT

A semiconductor device includes a differential amplifier and a first and a second pull-up transistor for generating a reference voltage. The second pull-up transistor has a gate connected to an output terminal of the differential amplifier. The differential amplifier is such that, when an output voltage thereof previously outputted is at a high level, both the first and second pull-up transistors become conductive so that the reference voltage becomes equilibrium at a high level voltage, and when an output voltage previously outputted is at a low level, the first pull-up transistor becomes conductive and the second pull-up transistor becomes non conductive so that the reference voltage becomes equilibrium at a low level voltage. With this arrangement, a high speed operation of the differential amplifier is realized.

8 Claims, 8 Drawing Sheets

SEMICONDUCTOR DEVICE WITH DIFFERENTIAL AMPLIFIER OPERABLE AT HIGH SPEED

BACKGROUND OF THE INVENTION (1) Field of the Invention

The present invention relates to a semiconductor device, and more particularly to a semiconductor device which is constituted mainly by field effect transistors (FETs) and use of which speeds up and stabilizes the read operation in the device.

(2) Description of the Related Art

Conventionally, in a semiconductor device of the kind to which the present invention relates, a plurality of memory elements are arranged in a matrix form, and a gate, a drain and a source of each of the memory elements are connected to a word line, a digit line and ground, respectively.

In the foregoing semiconductor device, when an address data is inputted to the semiconductor device, one of the memory elements is selected by one word line and one digit line which are made active by the address data.

Further, for writing the data, a threshold voltage of a high level or a low level is selectively assigned to the memory elements. That is, where, when data is written, a voltage of the select word line is $V_G$, a threshold voltage of the low level is $V_{TL}$, and a threshold voltage of the high level is $V_{TH}$, these voltages will be set as follows:

$$V_{TL}=2\ V<V_G=5\ V<V_{TH}=7\ V.$$

The read circuit for the foregoing memory elements is, as shown in FIG. 1, constituted by a pull-up transistor $Q_1$ for a memory element M1, a pull-up transistor $Q_6$ and a pull-down transistor $Q_5$ for generating a reference voltage, and a differential amplifier 1 for amplifying and outputting a difference in voltages applied to one input terminal S1 and the other input terminal S2. In this circuit, the memory element M1 is selected by the select word line W1 and the select digit line D1.

Here, if the threshold voltage $V_M$ of the memory element M1 is higher than the voltage $V_G$ of the select digit line, i.e., $V_G<V_M$, the memory element M1 becomes non-conductive, and the select digit line D1 is made equilibrium at a high level voltage $V_H$ by the pull-up transistor $Q_1$ which is in a conductive state. The memory element M1 under this state is called "OFF-bit".

On the other hand, if the threshold voltage $V_M$ of the memory element M1 is lower than the voltage $V_G$ of the select digit line, i.e., $V_M<V_G$, the memory element M1 becomes conductive and, thus, the select digit line D1 is made equilibrium at a low level voltage $V_L$ which is lower than the above high level voltage $V_H$. The memory element M1 under this state is called "ON-bit".

Thus, the voltage of the select digit line D1 in the case where the selected memory element M1 is "OFF-bit" and that in the case where the same is "ON-bit" are different from each other. However, since the difference between the high level voltage $V_H$ and the low level voltage $V_L$ is as small as 1 V, generally a differential amplifier 1 is used in order to speedily amplify to, for example, a 5 V amplitude which is a CMOS level amplitude.

The select digit line D1 is connected to one input terminal S1 of the differential amplifier 1 and a reference voltage $V_R$ is applied to the other input terminal S2 thereof. Here, the reference voltage $V_R$ is set in advance to an intermediate voltage between the high level voltage $V_H$ and the low level voltage $V_L$, which can be expressed as follows:

$$V_L<V_R<V_H.$$

If the voltage $V_{S1}$ of the select digit line D1 is lower than the reference voltage $V_R$, i.e., $V_{S1}<V_R$, the output voltage $V_{SO}$ at an output terminal SO of the differential amplifier 1 will be at ground level (0 V). If the voltage $V_{S1}$ of the select digit line D1 is higher than the reference voltage $V_R$, i.e., $V_R<V_{S1}$, the output voltage $V_{SO}$ of the differential amplifier 1 will be at a power supply $V_{CC}$ level (=5 V)

Details as to how the high level voltage $V_H$, the low level voltage $V_L$ and the reference voltage $V_R$ are set are explained using the current-voltage characteristics of the pull-up transistor $Q_1$ and the memory element M1 shown in FIG. 2 and also the current-time characteristics at the output terminal SO of the differential amplifier 1 shown in FIG. 3.

If the pull-up transistor $Q_1$ is an N-channel enhancement mode transistor and its gate and drain are commonly connected to the power supply source $V_{CC}$, the current-voltage characteristics of the pull-up transistor $Q_1$ will be as shown by $I_1$ in FIG. 2.

On the other hand, if the memory element M1 is made an N-channel enhancement mode transistor and its gate is applied with a voltage $V_G$ of the select word line W1, the current-voltage characteristics of the memory element M1 in the case of "ON-bit" will be as shown by $I_{M1}$ in FIG. 2.

When the memory element M1 is in the "OFF-bit", no current flows in the memory element M1. Thus, specific values of the high level voltage $V_H$ and the low level voltage $V_L$ are calculated from the current-voltage characteristics $I_1$ of the pull-up transistor $Q_1$ and the current-voltage characteristics $I_{M1}$ of the memory element M1.

Specifically, the low level voltage $V_L$ is calculated from the crossing point of the current-voltage characteristics $I_1$ of the pull-up transistor $Q_1$ and the current-voltage characteristics $I_{M1}$ of the memory element M1. Also, the high level voltage $V_H$ is calculated from the current-voltage characteristics $I_1$ of the pull-up transistor $Q_1$ when the current does not flow therethrough (FIG. 2).

Here, the high level voltage $V_H$ may be expressed as:

$$V_H=V_{CC}-V_{TN},$$

wherein $V_{TN}$ is a threshold voltage of the N-channel transistor.

Where it is preferable to set the reference voltage $V_R$ such that, as seen in FIG. 3, the inversion speed $T_{INV(H)}$ of the differential amplifier 1 for a high level output and the inversion speed $T_{INV(L)}$ for a low level output become substantially the same, it may be set to:

$$V_R=(V_H+V_L)/2.$$

In FIGS. 2 and 3, the reference voltage $V_R$ calculated from this equation is shown by $V_{RM}$. The aforementioned technology has been disclosed in Japanese Patent Application Kokai Publication No. Hei 3-142790.

The method (circuit means) to be employed for generating the reference voltage $V_R$ is optional, but the exemplified method shown here is one in which the pull-up transistor $Q_6$ and the pull-down transistor $Q_5$ are caused to become conductive simultaneously.

In the foregoing conventional semiconductor device, the inversion speed of the differential amplifier at low level output is greatly dependent on or influenced by the time required for discharging the digit line through the memory element, hence by the current capability of the memory element.

However, in a semiconductor device having a large storage capacity, for example, a ROM (read only memory) having a memory data of 16 mega-bytes, since importance is attached to high integration of the device, the channel width of a memory element is extremely fine.

For the above reason, the current capability of the memory element is only about 10 μA whereas the current capability of other transistors is in the order of mA. Thus, the discharging speed of the select digit line, hence the inversion speed of the differential amplifier at a low level output, becomes extremely low.

On the other hand, the inversion speed of the differential amplifier at a high level output is largely dependent on or influenced by the time required for charging the select digit line through the pull-up transistor, hence by the current capability of the pull-up transistor.

However, if the current capability of the pull-up transistor is designed to be large, a voltage difference between voltages during "ON-bit" selection and "OFF-bit" selection in the select digit line becomes small, resulting in a lack of stability in the operation of the differential amplifier.

Furthermore, if the current capability of the pull-up transistor is too large with respect to the memory element, the select digit line will be excessively charged, leading to a problem that the next low level output cannot be effected.

Under the above circumstances, there will be no alternative but to set the current capability of the pull-up transistor to such an extremely small value of the order of μA as in the case of the memory element, in which case the charging speed of the select digit line, hence the inversion speed of the differential amplifier for a high level output, becomes extremely low.

As explained above, the conventional semiconductor device suffers from a problem that, since the charging and discharging speeds of the select digit line, that is, the inversion speeds of the differential amplifier, are extremely low, the device is not suited to applications in which high speed performance is required.

SUMMARY OF THE INVENTION

An object of the invention, therefore, is to overcome the problems existing in the prior art and to provide a semiconductor device in which a high speed operation of a differential amplifier is realized.

Another object of the invention is to provide a semiconductor device in which a high speed operation and also a stable operation of the differential amplifier are realized.

According to one aspect of the invention, there is provided a semiconductor device comprising:

a differential amplifier having a first and a second input terminal and an output terminal, for amplifying and outputting a difference between an input voltage inputted to the first input terminal and a predetermined voltage set in advance and supplied to the second input terminal; and a means to change the predetermined voltage depending on output levels at the output terminal of the differential amplifier.

The semiconductor device may further comprise a delay means between the output terminal of the differential amplifier and the means to change the predetermined voltage.

According to the invention, the differential amplifier for amplifying and outputting a difference between the input voltage and the predetermined voltage set in advance is provided with the predetermined voltage which is changed responsive to the output of the differential amplifier. This enables the realization of the high speed operation of the differential amplifier.

In the semiconductor device having the delay means, the output of the differential amplifier is delayed for a predetermined time period and the predetermined voltage is changed responsive to the output thus delayed. This enables the realization of the high speed and the stable operation of the differential amplifier.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
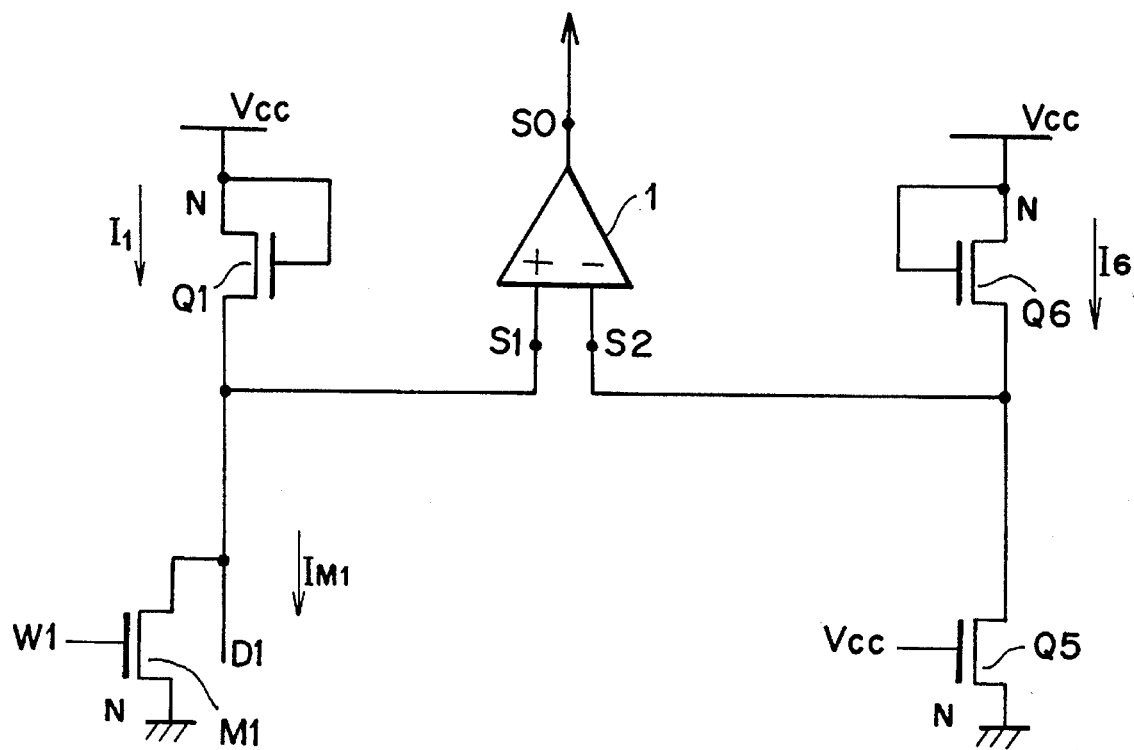
FIG. 1 is a circuit diagram showing a conventional circuit arrangement.
Figure 2:
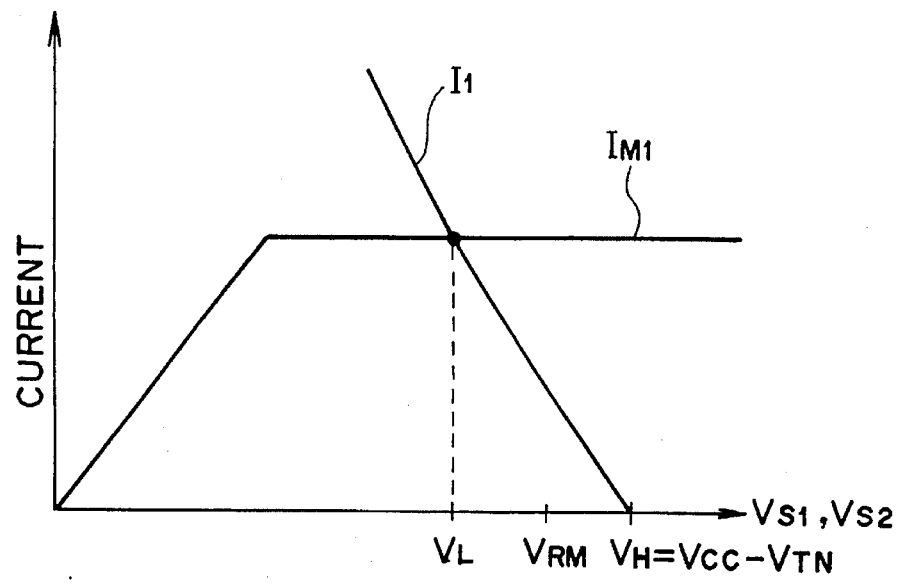
FIG. 2 is a diagram showing current-voltage characteristics of a pull-up transistor and a memory element in the conventional circuit shown in FIG. 1.
Figure 3:
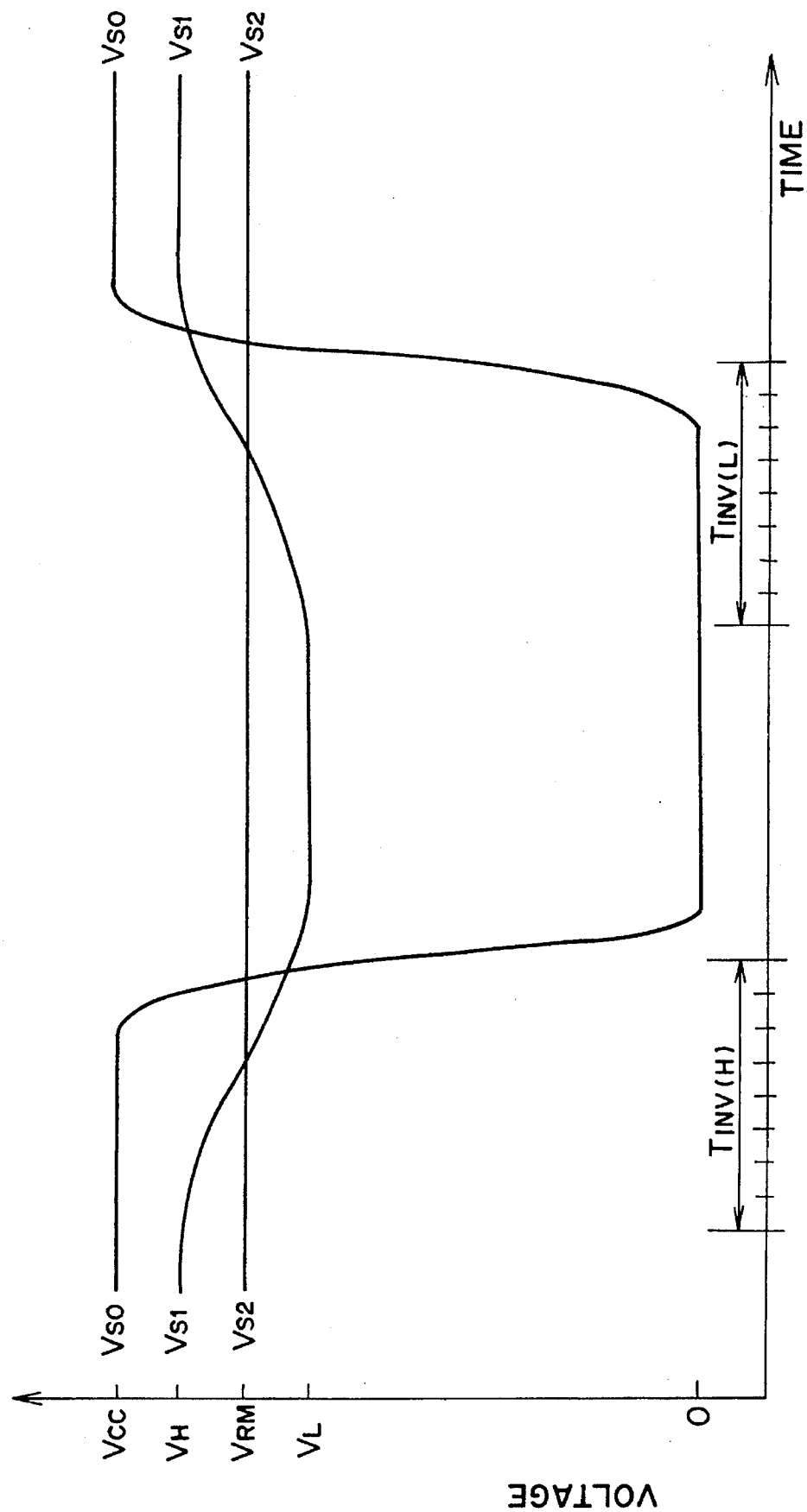
FIG. 3 is a diagram showing voltage-time characteristics at an output node of an differential amplifier in the conventional circuit shown in FIG. 1.
Figure 4:
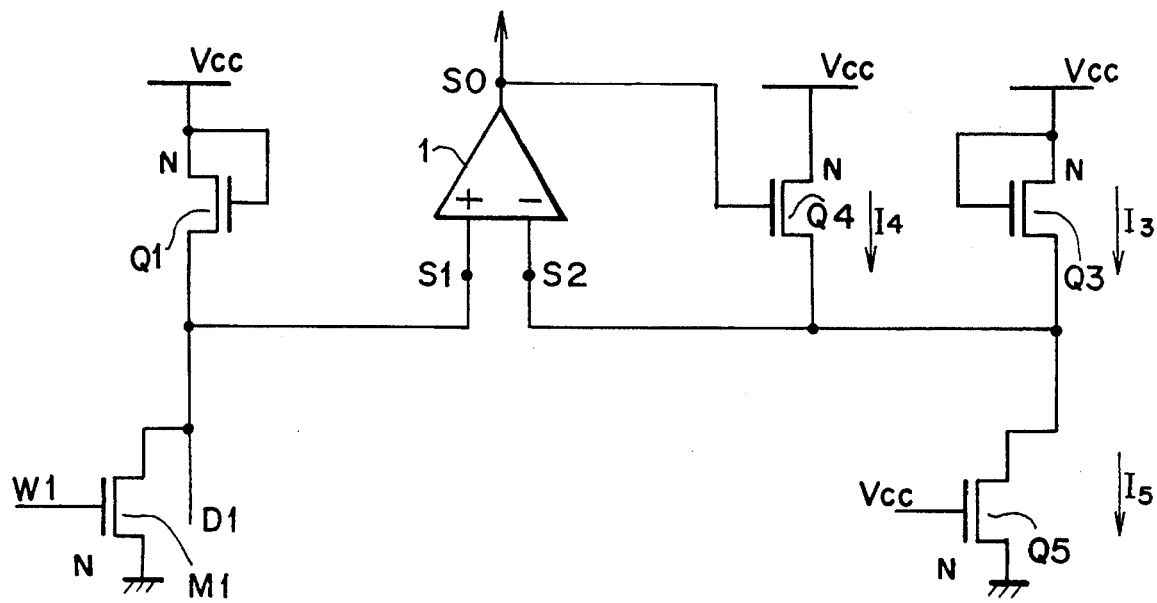
FIG. 4 is a circuit diagram showing a circuit arrangement of a first embodiment according to the invention.

FIG. 4 shows in a circuit diagram a configuration of a first embodiment according to the invention. The configuration of the read-out circuit of this embodiment is similar to that of the prior art shown in FIG. 1 except for the arrangement wherein, the circuit comprises pull-up transistors $Q_3$ and $Q_4$ in stead of the pull-up transistor $Q_6$ in the prior art. The pull-up transistors $Q_3$ and $Q_4$ constitute a variable reference voltage generator which is one of the features of the invention. The same reference numerals refer to the same elements and the description of the same element and the same operation or functions are not repeated here.

An output node SO of the differential amplifier 1 is connected to a gate of the pull-up transistor $Q_4$ so that, when an output voltage $V_{SO}$ of the previous differential amplifier 1 is at a high level, the pull-up transistors $Q_3$ and $Q_4$ both become conductive.

On the contrary, when the output voltage $V_{SO}$ of the differential amplifier 1 is at a low level, the pull-up transistor $Q_3$ becomes conductive and the pull-up transistor $Q_4$ becomes non-conductive.

Figure 5:
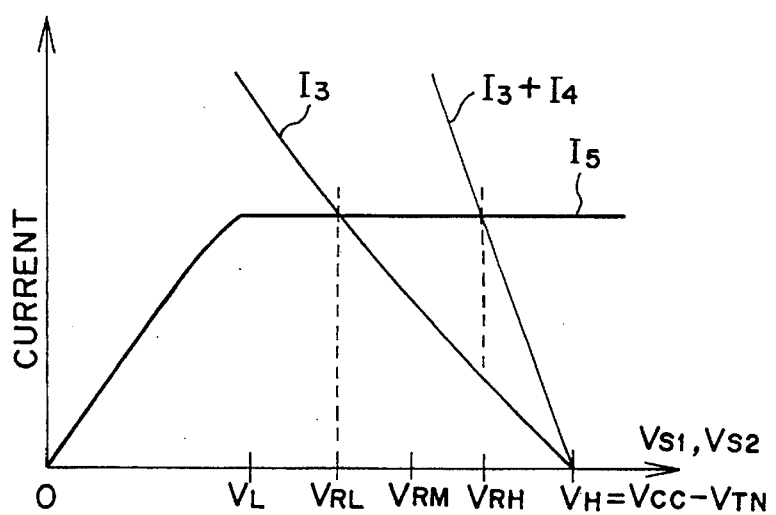
FIG. 5 is a diagram showing current-voltage characteristics in the first embodiment according to the invention.

FIG. 5 shows current-voltage characteristics in the first embodiment of the invention. In FIG. 5, the curve $I_3+I_4$ represents current-voltage characteristics under the state wherein the data outputted previously from the differential amplifier 1 is at a high level. Where the data outputted previously from the differential amplifier 1 is at a high level, the pull-up transistors $Q_3$ and $Q_4$ are both in conductive states so that the current-voltage characteristics as $I_3+I_4$ are attained.

Also, the curve 13 represents the current-voltage characteristics under the state where the data outputted previously from the differential amplifier 1 is at a low level. Where the data outputted previously from the differential amplifier 1 is at a low level, the pull-up transistors $Q_3$ is in a conductive state and the pull-up transistor $Q_4$ is in a non-conductive state so that the current-voltage characteristics as $I_3$ are attained.

The curve $I_5$ represents the current-voltage characteristics of the pull-down transistor $Q_5$. The pull-down transistor $Q_5$ is constantly in a conductive state so that the current-voltage characteristics as $I_5$ are attained.

Where data outputted previously from the differential amplifier 1 is at a high level, the voltage $V_{RH}$ which is the voltage where $I_3+I_4$ and $I_5$ cross with each other is applied as a reference voltage $V_R$ to the input terminal S2 of the differential amplifier 1. That is, the reference voltage $V_R$ becomes equilibrium at a voltage $V_{RH}$ when $I_3+I_4$ and $I_5$ cross with each other.

On the other hand, where data outputted previously from the differential amplifier 1 is at a low level, the voltage $V_{RL}$ which is a voltage where $I_3$ and $I_5$ cross with each other is applied as a reference voltage $V_R$ to the input terminal S2 of the differential amplifier 1. That is, the reference voltage $V_R$ becomes equilibrium at a voltage $V_{RL}$ when $I_3$ and $I_5$ cross with each other.

In other words, the reference voltage $V_R$ is set to the voltage $V_{RH}$ or the voltage $V_{RL}$ responsive to the logic level of the data outputted previously from the differential amplifier 1. In this case, these reference voltages $V_{RH}$ and $V_{RL}$ may be expressed as follows:

$$V_L<V_{RL}<V_{RM}<V_{RH}<V_H,$$

wherein $V_H$ is a high level voltage of the select digit line D1, $V_L$ is a low level voltage of the select digit line D1, and $V_{RM}$ is $(V_H+V_L)/2$.

Figure 6:
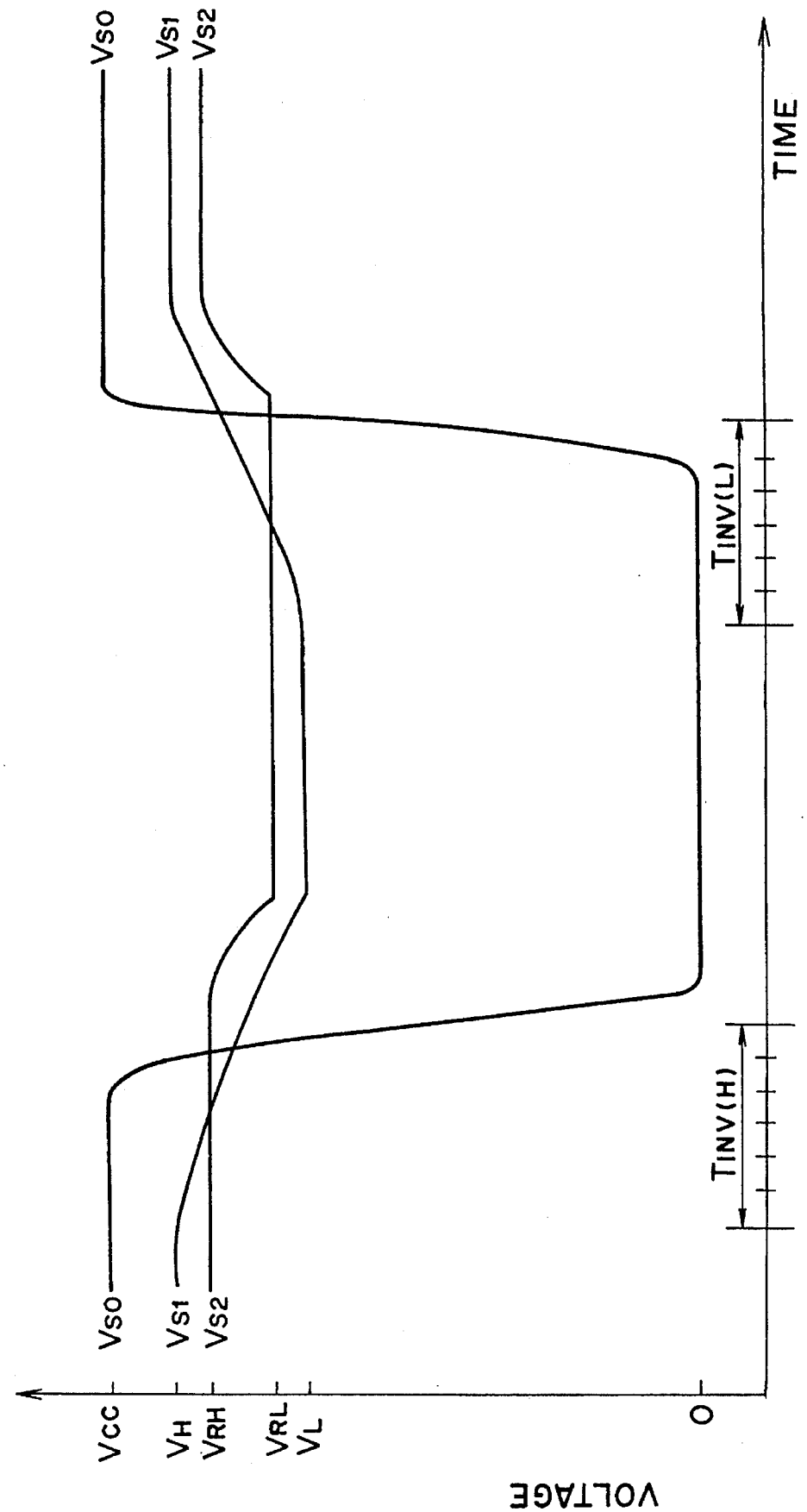
FIG. 6 is a diagram showing voltage-time characteristics in the first embodiment according to the invention.

FIG. 6 shows voltage-time characteristics in the first embodiment of the invention. The speeded-up operation of the differential amplifier 1 of the first embodiment of the invention is explained with reference to FIGS. 4, 5 and 6.

In the first embodiment of the invention, the voltage $V_{S2}$ of the input terminal S2 of the differential amplifier 1 becomes a voltage $V_{RH}$ when the data previously outputted is at a high level and the voltage $V_{S2}$ of the input terminal S2 of the differential amplifier 1 becomes a voltage $V_{RL}$ when the data previously outputted is at a low level.

That is, the voltage $V_{S2}$ at the input terminal S2 of the differential amplifier 1 varies depending on the logic value of the data previously outputted so that, when the select digit line D1 changes from the high level voltage $V_H$ to the low level voltage $V_L$ or from the low level voltage $V_L$ to the high level voltage $V_H$, the time in which the voltage $V_{S1}$ of the input terminal S1 exceeds the voltage $V_{RH}$ or the voltage $V_{RL}$ becomes short.

Therefore, the inversion speed of the differential amplifier 1 under the low level output state or the inversion speed of the differential amplifier 1 under the high level output state becomes fast. For example, where the inversion speed in the conventional differential amplifier 1 was 40 ns, the corresponding inversion speed in the first embodiment according to the invention is in the order of 32 ns, which accounts for the speed-up of more than 20%. Incidentally, where the same data continues, there is no occurrence of inversion in the differential amplifier 1 so that explanation therefore is omitted here.

Figure 7:
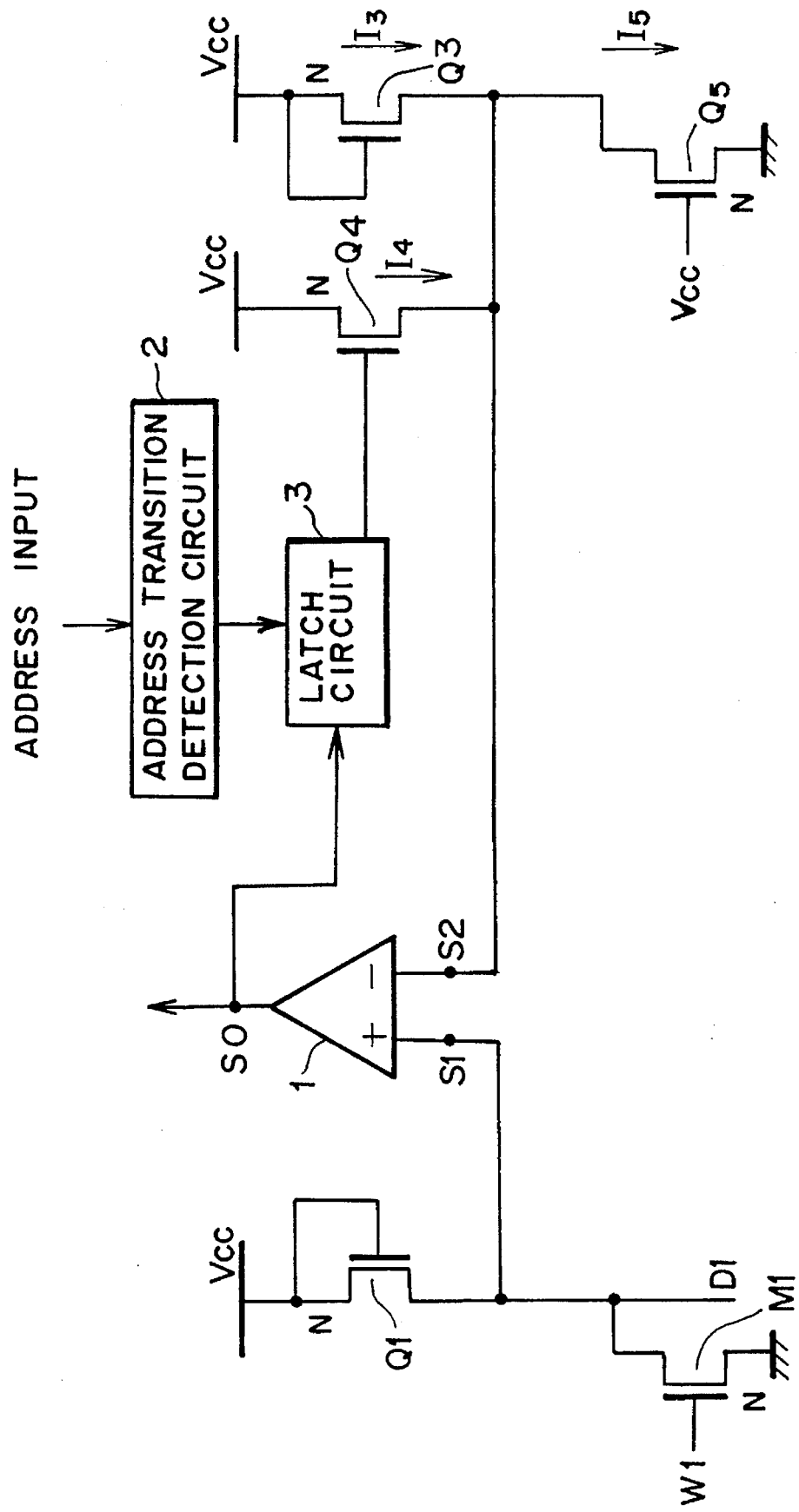
FIG. 7 is a circuit diagram showing a circuit arrangement of a second embodiment according to the invention.

FIG. 7 shows in a circuit diagram a circuit configuration of a second embodiment according to the invention. As seen therein, the configuration of this embodiment is the same as that in the first embodiment shown in FIG. 4 except for an arrangement wherein the output data of the differential amplifier 1 in this embodiment is first held at a latch circuit 3 with a controlled timing by an address transition detection circuit 2 and then is outputted to a gate of the pull-up transistor $Q_4$. The same reference numerals refer to the same elements and the description of the same element and the same function is not repeated.

The address transition detection circuit 2 detects whether the address data to the memory element M1 has undergone transition, that is, whether there has been a change in the address data from a high level to a low level, or a low level to a high level.

Upon detecting the transition of the address information to the memory element M1, the address transition detection circuit 2 generates and outputs to a latch circuit 3 a pulse signal for a predetermined period of time, that is, the control signal for controlling the activation and inactivation of the latch circuit 3.

In response to the control signal from the address transition detection circuit 2, the latch circuit 3 receives the input data from the differential amplifier 1, that is, the level of the output voltage $V_{SO}$ of the differential amplifier 1, holds such level for a predetermined time period, and then outputs it to the gate of the pull-up transistor $Q_4$.

Figure 8:
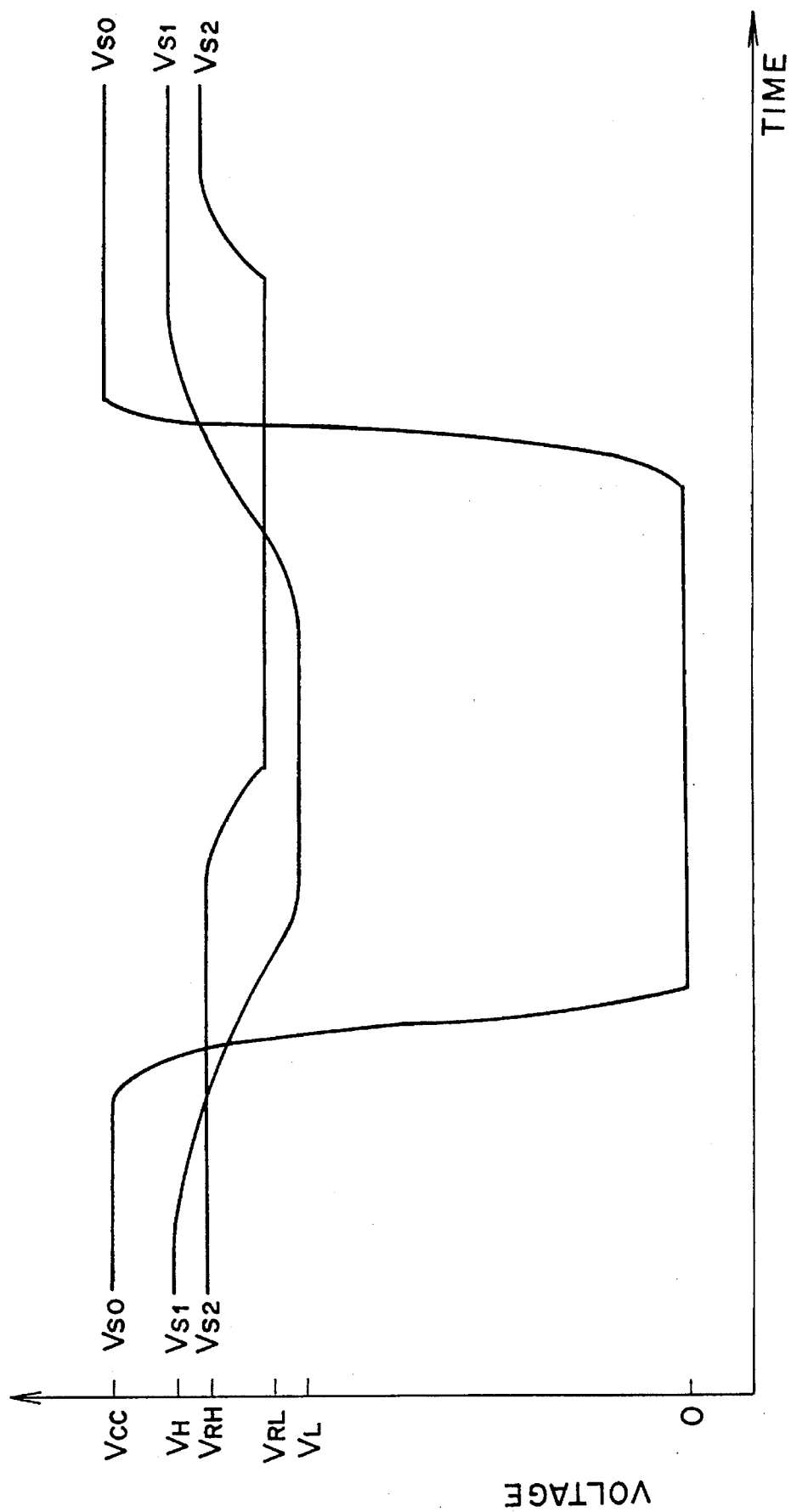
FIG. 8 is a diagram showing voltage-time characteristics in the second embodiment according to the invention.

FIG. 8 shows voltage-time characteristics in the second embodiment of the invention. The speeded-up and stabilized operation of the differential amplifier 1 of the second embodiment of the invention is explained with reference to FIGS. 7 and 8.

In the second embodiment, use is made of both the address transition detection circuit 2 and the latch circuit 3 thereby enabling to control the timing for the pull-up transistor $Q_4$ to become conductive or non-conductive, that is, the timing for changing the reference voltage (the voltage $V_{S2}$ at the input terminal S2 of the differential amplifier 1).

In the first embodiment, the level of the voltage $V_{S2}$ at the input terminal S2 of the differential amplifier 1 changes during the inversion period of the output voltage $V_{SO}$ of the differential amplifier 1 but, in the second embodiment, it is possible to cause the voltage $V_{S2}$ at the output terminal S2 to change after the completion of the inversion of the output voltage $V_{SO}$ of the differential amplifier 1.

That is, in the first embodiment, since the voltage $V_{S2}$ at the input terminal S2 changes under the state in which the level of the output voltage $V_{SO}$ of the differential amplifier 1 is not yet determined, there is a possibility for the differential amplifier to malfunction with a change of the voltage $V_{S2}$ at the input terminal S2.

However, in the second embodiment, since the voltage $V_{S2}$ at the input terminal S2 changes after the completion of inversion of the output voltage $V_{SO}$ of the differential amplifier 1, it is possible to prevent the malfunction of the differential amplifier 1 which may otherwise be caused by a change of the voltage $V_{S2}$ at the input terminal S2.

Therefore, in the second embodiment, the inversion speed of the differential amplifier 1 is made faster whereby the operation of the differential amplifier 1 is speeded up, and also the operation of the differential amplifier 1 is stabilized due to the prevention of the malfunction of the differential amplifier that may occur due to a change in the voltage $V_{S2}$ of the input terminal S2.

Figure 9:
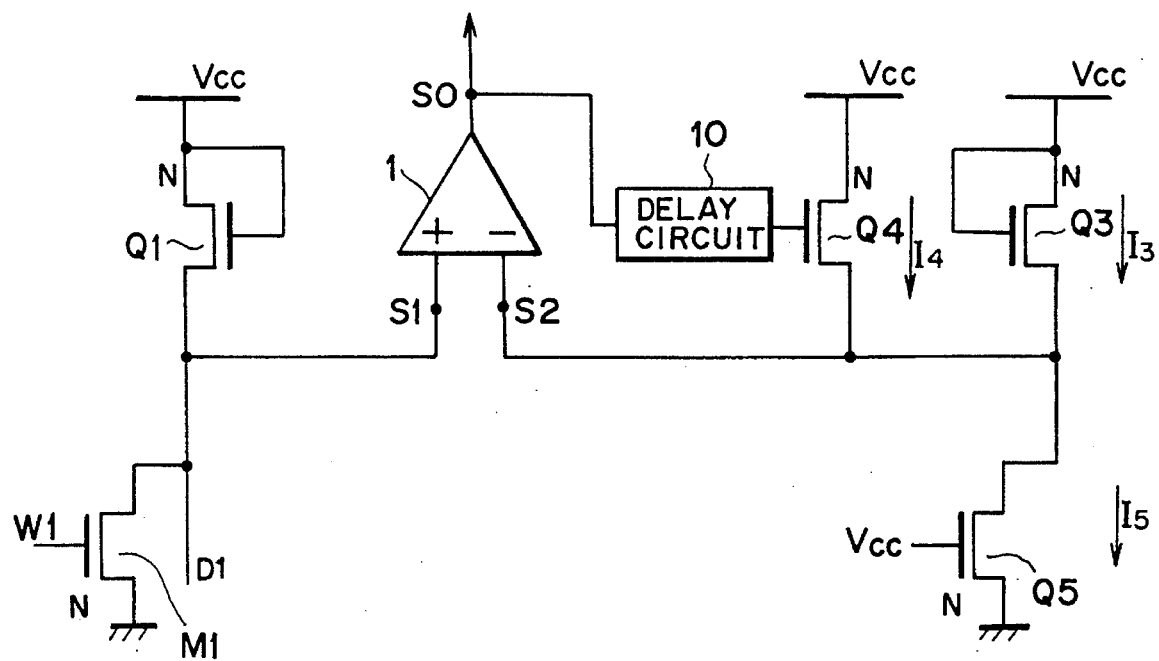
FIG. 9 is a circuit diagram showing a modified circuit arrangement of the second embodiment according to the invention.

Furthermore, in the second embodiment, a modification can be made such that, without using the address transition detection circuit 2, the latch circuit 3 may be replaced by a delay circuit 10 as shown in FIG. 9, which allows a possible method for controlling the timing of a change of the voltage $V_{S2}$ at the input terminal S2.

Figure 10:
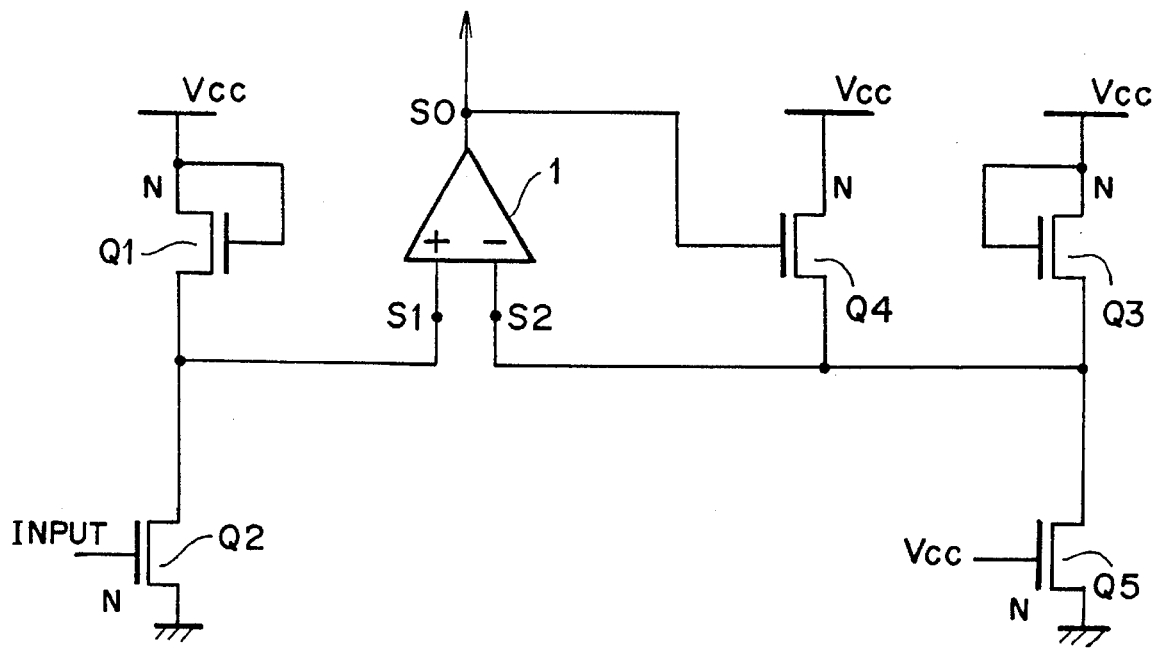
FIG. 10 is a circuit diagram showing a circuit arrangement of a third embodiment according to the invention.

FIG. 10 shows in a circuit diagram a circuit configuration of a third embodiment according to the invention. As seen therein, the configuration of this embodiment is the same as that in the first embodiment shown in FIG. 4 except for an arrangement wherein the memory element M1 in FIG. 4 is replaced by the pull-down transistor $Q_2$. The same reference numerals refer to the same elements and the description of the same element and the same function is not repeated.

The pull-down transistor $Q_2$ is caused to be in a conductive state or a non-conductive state depending on the level of the input signal inputted to the gate of the pull-down transistor $Q_2$. The voltage $V_{S2}$ of the input terminal S2 of the differential amplifier 1 also changes depending on the change in the voltage $V_{S1}$ of the input terminal S1 of the differential amplifier 1 caused by the conductive state or the non-conductive state of the pull-down transistor $Q_2$.

Therefore, in this third embodiment of the invention, too, since the voltage $V_{S2}$ of the input terminal S2 is caused to be changed depending on the logic level of the output data outputted previously from the differential amplifier 1, it is possible to make the inversion speed of the differential amplifier faster, whereby a higher speed operation of the differential amplifier 1 can be realized.

Figure 11:
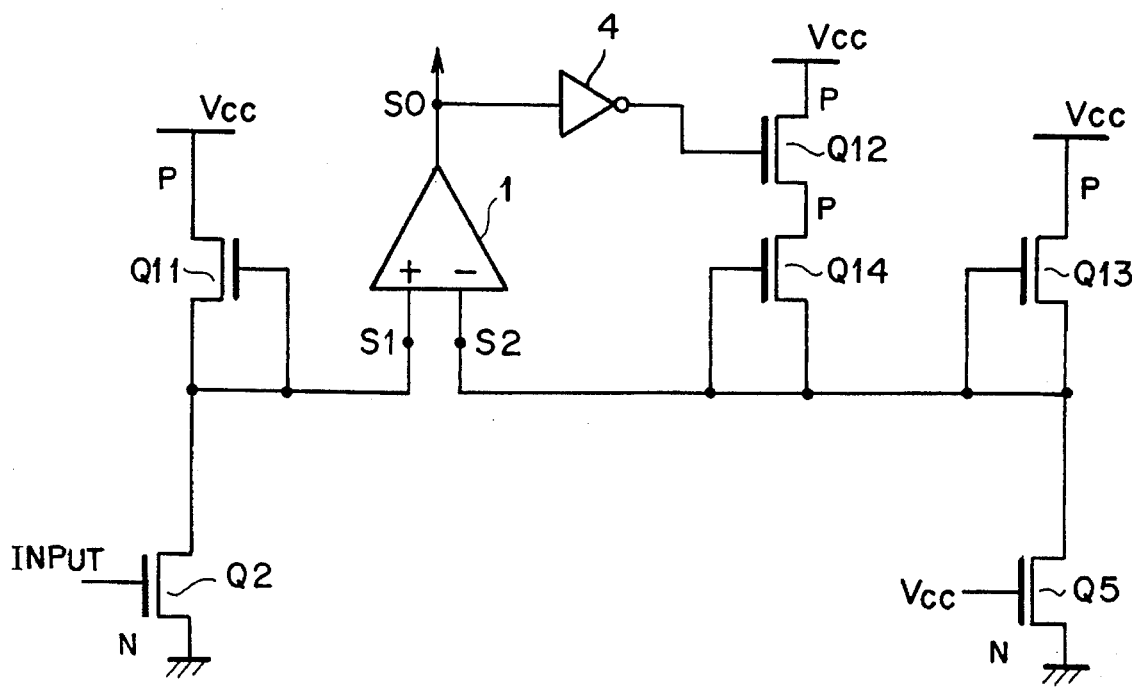
FIG. 11 is a circuit diagram showing a circuit arrangement of a fourth embodiment according to the invention.

FIG. 11 shows in a circuit diagram a circuit configuration of a fourth embodiment according to the invention. As seen therein, the configuration of this embodiment is the same as that in the third embodiment shown in FIG. 10 except for an arrangement wherein the pull-up transistors $Q_1$, $Q_3$ and $Q_4$ in FIG. 10 are replaced by pull-up transistors $Q_{11}$, $Q_{12}$, $Q_{13}$ and $Q_{14}$ as well as an inverting amplifier 4. The same reference numerals refer to the same elements and the description of the same element and the same function is not repeated.

In the third embodiment of the invention, the pull-up transistors $Q_1$, $Q_3$ and $Q_4$ are N-channel transistors. In this fourth embodiment, however, instead of such pull-up transistors $Q_1$, $Q_3$ and $Q_4$, the use is made of the pull-up transistors $Q_{11}$, $Q_{12}$, $Q_{13}$ and $Q_{14}$ which are P-channel transistors.

As explained hereinabove, in all of the first, second, third and fourth embodiments, the high speed operation of the differential amplifier 1 is realized by controlling the switching between the conductive state and the non-conductive state of the pull-up transistors $Q_3$, $Q_4$, $Q_{12}$, $Q_{13}$ and $Q_{14}$.

However, it is also possible to realize the high speed operation of the differential amplifier 1 by controlling the switching between the conductive state and the non-conductive state of the pull-down transistors. Also, it is possible to use resistor elements as a pull-up or pull-down means instead of transistors.

In the first, second, third and fourth embodiments, in order to speed up the operation of the differential amplifier, one of the techniques used is to proximate the reference voltage $V_R$ to the voltage $V_{S1}$ of the input terminal S1. However, if only the stabilization of the differential amplifier is to be pursued, a method may be available whereby the magnitude of the reference voltage $V_R$ is made significantly different from that of the voltage $V_{S1}$ at the input terminal S1.

Thus, with the arrangement whereby the reference voltage $V_R$ at the input terminal S2 of the differential amplifier 1 is caused to be changed depending on the output voltage $V_{SO}$ of the differential amplifier 1, it is possible to realize the high speed operation of the differential amplifier 1.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:
   a differential amplifier having a first and a second input terminal and an output terminal, for amplifying and outputting a difference between an input voltage inputted to said first input terminal and a predetermined voltage set in advance and supplied to said second input terminal; and
   a variable reference voltage generator for changing said predetermined voltage depending on output levels at the output terminal of said differential amplifier to decrease the difference between said predetermined voltage and said input voltage.

2. The semiconductor device according to claim 1, which includes a memory element and in which an output voltage from said memory element is inputted to said first input terminal of said differential amplifier as the input voltage.

3. The semiconductor device according to claim 1, wherein said variable reference voltage generator comprises a first pull-up transistor and a second pull-up transistor for generating a reference voltage, each having a source-drain path connected between a power supply source and said second input terminal of said differential amplifier, a gate of said first pull-up transistor being connected to said power supply source and a gate of said second pull-up transistor being coupled to the output terminal of said differential transistor,
   said differential amplifier being such that, when an output voltage thereof previously outputted is at a high level, both said first and second pull-up transistors become conductive so that said reference voltage becomes equilibrium at a high level voltage, and when an output voltage previously outputted is at a low level, said first pull-up transistor becomes conductive and said second pull-up transistor becomes non-conductive so that said reference voltage becomes equilibrium at a low level voltage.

4. The semiconductor device according to claim 3, wherein said first and second pull-up transistors are N-channel field effect transistors.

5. The semiconductor device according to claim 3, which comprises a delay means connected between the output terminal of said differential amplifier and the gate of said second pull-up transistor, said delay means being for delaying an output of said differential amplifier for a predetermined time period and outputting the output thus delayed to said variable reference voltage generator.

6. The semiconductor device according to claim 5, which includes a memory element and in which said delay means comprises an address transition detection circuit for detecting level changes in an address data supplied to said memory element and outputting a latch control signal, and a latch circuit for holding the output of said differential amplifier for a predetermined time period in response to said latch control signal from said address transition detection circuit and outputting the output thus latched to said variable reference generator.

7. The semiconductor device according to claim 1, wherein said variable reference voltage generator comprises:

a first pull-up transistor having a source-drain path connected between a power supply source and said second input terminal of said differential amplifier, and a gate connected to said second input terminal of said differential amplifier;

a second and a third pull-up transistor serially connected between the power supply source and said second input terminal of said differential amplifier, a gate of said third pull-up transistor being connected to said second input terminal of said differential amplifier; and an inverter having an input terminal connected to the output terminal of said differential amplifier and an output terminal connected a gate of said second pull-up transistor.

8. The semiconductor device according to claim 7, wherein said first, second and third pull-up transistors are P-channel field effect transistors.

* * * * *